US011963413B2

(12) United States Patent
Katsui et al.

(10) Patent No.: US 11,963,413 B2
(45) Date of Patent: Apr. 16, 2024

(54) DISPLAY

(71) Applicants: JSR CORPORATION, Tokyo (JP); Mattrix Technologies, Inc, Gainesville, FL (US)

(72) Inventors: Hiromitsu Katsui, Minato-ku (JP); Bo Liu, Gainesville, FL (US); Maxime Lemaitre, Gainesville, FL (US)

(73) Assignees: JSR CORPORATION, Tokyo (JP); MATTRIX TECHNOLOGIES, INC., Gainesville, FL (US)

( * ) Notice: Subject to any disclaimer, the term of this patent is extended or adjusted under 35 U.S.C. 154(b) by 0 days.

(21) Appl. No.: 18/022,223

(22) PCT Filed: Aug. 12, 2021

(86) PCT No.: PCT/JP2021/029725
§ 371 (c)(1),
(2) Date: Feb. 20, 2023

(87) PCT Pub. No.: WO2022/039100
PCT Pub. Date: Feb. 24, 2022

(65) Prior Publication Data
US 2023/0320149 A1    Oct. 5, 2023

Related U.S. Application Data

(60) Provisional application No. 63/227,522, filed on Jul. 30, 2021.

(30) Foreign Application Priority Data

Aug. 21, 2020    (JP) .................................. 2020-140368

(51) Int. Cl.
*H10K 59/131*    (2023.01)
*G09G 3/3233*    (2016.01)
(Continued)

(52) U.S. Cl.
CPC ......... *H10K 59/131* (2023.02); *G09G 3/3233* (2013.01); *H10K 50/30* (2023.02);
(Continued)

(58) Field of Classification Search
CPC .. H10K 59/131; H10K 59/1201; H10K 50/30; G09G 3/3233; G09G 2300/0426;
(Continued)

(56) References Cited

U.S. PATENT DOCUMENTS

2013/0240842 A1* 9/2013 Rinzler ................ H10K 59/125
257/329
2019/0138783 A1* 5/2019 Yang ...................... G06F 3/0412

FOREIGN PATENT DOCUMENTS

CN    110911585 A  *  3/2020  ......... H01L 27/3246
JP    2009260127 A    11/2009
(Continued)

OTHER PUBLICATIONS

Mccarthy et al. (2016). P-206L: Late-News Poster: QVGA AMOLED Displays Using the Carbon Nanotube Enabled Vertical Organic Light Emitting Transistor. SID Symposium Digest of Technical Papers. 47. 1796-1798. DOI:10.1002/sdtp.11071 (Year: 2016).*
(Continued)

*Primary Examiner* — Mark Edwards
(74) *Attorney, Agent, or Firm* — Thomas | Horstemeyer, LLP

(57) ABSTRACT

A liquid crystal display device includes: a substrate; a plurality of vertical organic light-emitting transistors; a data line that supplies a voltage to a gate electrode of the vertical organic light-emitting transistor; a thin-film transistor that is connected between the gate electrode of each of the vertical organic light-emitting transistors and the data line and controls supply of the voltage to the gate electrode of the vertical organic light-emitting transistor; a gate line that is
(Continued)

connected to the gate electrode of the thin-film transistor and transmits a signal for switching the thin-film transistor; and a plurality of current supply lines that are wired in a first direction outside a formation region of the vertical organic light-emitting transistor, the current supply lines being in contact with a source electrode of the vertical organic light-emitting transistor to supply a current to the vertical organic light-emitting transistor.

10 Claims, 11 Drawing Sheets

(51) Int. Cl.
    *H10K 50/30*     (2023.01)
    *H10K 59/12*     (2023.01)

(52) U.S. Cl.
    CPC . *H10K 59/1201* (2023.02); *G09G 2300/0426* (2013.01); *G09G 2300/0842* (2013.01); *G09G 2300/0861* (2013.01); *G09G 2310/0202* (2013.01); *G09G 2320/0223* (2013.01)

(58) Field of Classification Search
    CPC ... G09G 2300/0842; G09G 2300/0861; G09G 2310/0202; G09G 2320/0223
    USPC ......................................................... 345/212
    See application file for complete search history.

(56) References Cited

FOREIGN PATENT DOCUMENTS

| | | |
|---|---|---|
| JP | 2014505324 A | 2/2014 |
| JP | 2018197864 A | 12/2018 |
| WO | 2009036071 A2 | 3/2009 |
| WO | 2012078759 A2 | 6/2012 |
| WO | 2014071343 A1 | 5/2014 |

OTHER PUBLICATIONS

Written Opinion of the International Searching Authority of PCT/JP2021/029725.
Office Action issued for JP 2020-140368, dated Jun. 24, 2023.
Office Action issued for JP 2020-140368, dated Jun. 27, 2023.

* cited by examiner

DISPLAY

CROSS-REFERENCE TO RELATED APPLICATIONS

This application is a national stage entry pursuant to 35 U.S.C. § 371 of Patent Cooperation Treaty (PCT) international application No. PCT/JP2021/029725, filed on Aug. 12, 2021, which claims priority to, and the benefit of, U.S. provisional application No. 63/227,522, filed on Jul. 30, 2021, and JP patent application No. 2020-140368, filed on Aug. 21, 2020, which are all hereby incorporated by reference in their entireties.

TECHNICAL FIELD

The present invention relates to a display.

BACKGROUND ART

In recent years, a light source element using an organic semiconductor element has been put into practical use, and a display using an organic semiconductor element as a light source element has been commercially available. In the development of the display using the organic semiconductor element as the light source element, studies on higher brightness, higher definition, lower power consumption, and longer life have been continuously conducted to further improve performance.

The pixel of the conventional display using an organic semiconductor element as a light-emitting element is made up of an organic light-emitting diode (also referred to as "OLED") and a transistor that controls a current allowed to flow through the organic light-emitting diode. The organic light-emitting diode is a device that emits light in accordance with a current input from a thin-film transistor (also referred to as "TFT") formed on a substrate to an organic electroluminescent (EL) layer sandwiched between an anode electrode and a cathode electrode.

However, with respect to this configuration, Patent Document 1 below describes a vertical organic light-emitting transistor (also referred to as "VOLET") that adjusts a flowing current by controlling a voltage applied to a gate electrode as an element for reducing the number of control elements and increasing a light-emitting area to increase luminance, the transistor emitting light in accordance with an amount of the current flowing through the transistor itself. Patent Document 2 below describes a display using a vertical organic light-emitting transistor, and a significant increase in the luminance of the display has been expected.

PRIOR ART DOCUMENT

Patent Document

Patent Document 1: WO 2009/036071
Patent Document 2: JP-T-2014-505324
Patent Document 3: JP-A-2018-197864

SUMMARY OF INVENTION

Technical Problem

In recent years, displays are used not only for home televisions and personal computers but also for various purposes such as advertisements in stations and backgrounds of event halls. As a result, in the development of the present display, along with the performance improvement described above, enlargement has become a major problem.

In the display using the organic semiconductor element, an organic light-emitting diode, a thin-film transistor, and the like that forms a pixel is disposed in a display unit, and a driver that drives these is disposed in an outer edge portion of the display unit. Such a configuration is still adopted in many displays as a general configuration at present.

According to this configuration, when the display is enlarged, the transmission distance of a signal output from each driver arranged in the outer edge portion is increased in order to control and drive each element over the entire display unit. Then, the wiring connecting the driver and each element becomes long, and the resistance value of the wiring between the driver and the element becomes large. When the resistance value of the wiring increases, for example, a voltage drop (also referred to as "IR-Drop") due to a flowing current or a signal delay or deterioration is caused.

In particular, in a current supply line for supplying a current to the light-emitting element, when the resistance value of the wiring increases, even in a case where the same voltage is applied to allow a current to flow from a current supply unit to each light-emitting element, the voltage drops in accordance with the resistance value of the wiring and the flowing current as the distance from the current supply unit increases. Then, the amount of current actually supplied with respect to a current value necessary for displaying image data decreases. Then, when this influence becomes remarkable, a display defect occurs to make a gradual decrease in luminance visually recognizable by a person. Furthermore, in many cases, the current supply line is configured to be shared by a group of light-emitting elements arranged in a line. Therefore, when the resistance value of the wiring of the current supply line varies, a difference in luminance occurs in each line, and a linear display defect occurs.

As a method for taking a measure against the above problem, it is conceivable to apply, to the current supply line, a method of detecting the light emission luminance of each pixel and supplying the data line with a voltage in consideration of the amount of voltage drop as described in Patent Document 3. However, when a complicated circuit is added, the light-emitting region is greatly compressed, and high luminance is hindered. Furthermore, since the number of elements increases, there is a possibility that a failure or a defect is likely to occur.

In addition, the use of the outer edge portion where the driver is disposed, the addition of an external device, and the like are conceivable, but the enlargement of the outer edge portion and the addition of the external device limit the use mode and the mounting place of the display even though various uses are required.

Furthermore, a case is conceivable where an error occurs in a calculation method when a voltage value assuming a variation is applied in control by feedback and the like, and there is a considerable possibility that a change in luminance is not corrected so as not to be visually unrecognizable as a display defect. Hence, the measure against the display defect is desirably taken by the structure of the device rather than by the correction of the change in luminance.

Here, the inventors of the present invention examined a display using a vertical organic light-emitting transistor and found that the vertical organic light-emitting transistor further has the following problems.

Similarly to a field-effect transistor, the vertical organic light-emitting transistor has a configuration including a source electrode, a gate electrode, and a drain electrode.

However, unlike the field-effect transistor such as a thin-film transistor, the vertical organic light-emitting transistor is provided with a light-emitting layer including an organic EL layer and an organic semiconductor layer between the source electrode and the drain electrode. Due to the characteristics of the materials of these layers, the vertical organic light-emitting transistor is characterized in that a current flowing between the source electrode (anode electrode) and the drain electrode (cathode electrode) is easily affected by a voltage applied between the electrodes, as compared with a field-effect transistor such as a thin-film transistor.

That is, the display using the vertical organic light-emitting transistor is characterized in that the luminance fluctuates more greatly with respect to the voltage drop of the current supply line than in the configuration of the conventional organic light-emitting diode and thin-film transistor, and the display defect as described above more easily appears.

In view of the above problems, an object of the present invention is to provide a display using a vertical organic light-emitting transistor in which voltage fluctuation of a current supply line is reduced.

Solution to Problem

A display of the present invention includes: a substrate; a plurality of vertical organic light-emitting transistors arranged in an array on the substrate in a first direction and a second direction orthogonal to the first direction, the vertical organic light-emitting transistors each being formed in order of a gate electrode, a source electrode, and a drain electrode from the substrate side in a third direction that is orthogonal to the first direction and the second direction and having a light-emitting layer between the source electrode and the drain electrode; a data line that supplies a voltage to the gate electrode of the vertical organic light-emitting transistor; a thin-film transistor that is connected between the gate electrode of each of the vertical organic light-emitting transistors and the data line and controls supply of a voltage to the gate electrode of the vertical organic light-emitting transistor; a gate line that is connected to the gate electrode of the thin-film transistor and transmits a signal for switching between energization and interruption of the thin-film transistor; and a plurality of current supply lines that are wired in a first direction outside a formation region of the vertical organic light-emitting transistor and in a region at the same distance from the substrate as the gate electrode of the vertical organic light-emitting transistor or a region more away from the substrate than the gate electrode with respect to a third direction, the current supply lines being in contact with a source electrode of the vertical organic light-emitting transistor to supply a current to the vertical organic light-emitting transistor.

The "formation region of the vertical organic light-emitting transistor" in the present specification refers to a region where a current flows from the source electrode toward the drain electrode via the light-emitting layer to emit light when a voltage equal to or higher than a threshold value is applied between the gate electrode and the source electrode of the vertical organic light-emitting transistor.

The manufacturing process of the semiconductor is performed such that materials are laminated in a predetermined order on the substrate in accordance with the materials, growth directions, and the like, and in general, a wiring layer connecting each element and a layer forming the element itself are formed separately. For this reason, for example, in a case where wiring such as a current supply line is produced in the same layer as metal wiring in the lower layer, the width of the wiring is limited in order to prevent current leakage with another wiring in the same layer, or a film thickness of a wiring layer is limited in order to prevent leakage between each wiring caused by foreign matters and the like at the time of intersection with many wirings via an insulating film and to prevent disconnection and the like due to crossing over a wiring step.

Further, for electrically connecting the current supply line formed in the lower layer and the source electrode of the vertical organic light-emitting transistor, it is necessary to form a contact hole penetrating through multiple layers of insulating films.

However, the contact hole cannot be formed so large from the viewpoint of the restriction of the wiring width, variation in characteristics, and the accuracy in formation, so that it is difficult to reduce the resistance value to such an extent that hardly contributes to the voltage drop, and there is a concern about contact failure in the contact hole portion.

Therefore, with the above configuration, the current supply line can obtain a low-resistance connection because the restriction on the wiring width and the wiring film thickness is alleviated to enable the creation of wiring having lower resistance and also alleviate restriction on the contact hole. In addition, depending on the layer configuration, the current supply line and the source electrode of the vertical organic light-emitting transistor can be directly connected without the contact hole.

Thus, the resistance value of the path from the driver that supplies the current to the source electrode of the vertical organic light-emitting transistor is reduced by the amount not passing through the contact hole. By these effects, the fluctuation of the voltage supplied to the source electrode of the vertical organic light-emitting transistor is reduced, and the occurrence of the display defect is prevented.

For the display using the organic light-emitting element, there is a system in which light is emitted via the substrate as one light-emitting system. In this case, in this configuration, it is preferable that the number of wirings, thin-film transistors, and the like on the side closer to the substrate than the vertical organic light-emitting transistor be as small as possible so as not to block the light emitted from the light-emitting layer. The system in which light is emitted through the substrate is also referred to as a "bottom emission system" and has the advantage that wiring connection between electrodes is easy, and manufacturing is easy. A system in which light is emitted to the side opposite to the substrate is also referred to as a "top emission system", and the above configuration can also form a display of the top emission.

With the above configuration, the current supply line is not formed on the side closer to the substrate than the gate electrode of the vertical organic light-emitting transistor, and a wider light-emitting region is ensured. Therefore, the display with the above configuration also has an effect of higher luminance than the conventional display.

In the display, the light-emitting layer of the vertical organic light-emitting transistor is formed across the plurality of vertical organic light-emitting transistors, and a formed bank layer may be provided between the current supply line and the light-emitting layer.

Further, in the display, the bank layer may be formed between the source electrode and the light-emitting layer and in a region different from the gate electrode when viewed from the third direction.

The current supply line is a line that supplies a current to the source electrode, and when the current supply line and the light-emitting layer are energized, there is a possibility that light is emitted regardless of the voltage applied to the gate electrode.

Therefore, with the above configuration, the light-emitting layer and the current supply line are not energized, an unintended current including a leakage current is prevented, and unintended light emission is prevented.

Note that a layer in addition to the bank layer may be included between the current supply line and the light-emitting layer. For example, a configuration is conceivable where an electrode material made of carbon nanotubes is formed on a surface layer with the source electrode serving as a base. In this case, the bank layer and the source electrode made of carbon nanotubes are formed between the current supply line and the light-emitting layer.

In the display, an organic resin layer may be provided between the current supply line and the gate electrode of the vertical organic light-emitting transistor.

Further, in the display, the organic resin layer may be formed between the gate electrode of the vertical organic light-emitting transistor and the source electrode of the vertical organic light-emitting transistor so as to overlap with a peripheral end of the gate electrode of the vertical organic light-emitting transistor when viewed from the third direction.

The "peripheral end" regarding each layer in the present specification is an outermost peripheral region having a certain width from the edge when each layer is viewed from the third direction. The width of the peripheral end overlapping with the organic resin layer is in a range of several tens of nm to several μm. More specifically, the width is preferably in a range of 200 nm to 5 μm, and more preferably in a range of 500 nm to 2 μm from the viewpoint of ensuring a light-emitting region, reducing the size of a thin-film transistor, a leakage current, and a parasitic capacitance, and the like.

The current supply line has a risk of generating a leakage current when the gate electrode and the like exist nearby. For example, when a leakage current is generated to the gate electrode, the voltage of the gate electrode fluctuates so as to approach the source electrode voltage that is the voltage of the current supply line.

Even in a case where the current supply line is formed in a layer different from the gate electrode via the insulating film, when the gate electrode and the current supply line overlap with each other, a parasitic capacitance is generated, and either voltage fluctuation may affect one voltage or a larger current may be required at the time of charging the electrode.

Then, in the vertical organic light-emitting transistor, the voltage supplied from the data line to the gate electrode slightly fluctuates so as to attain a predetermined luminance, and the vertical organic light-emitting transistor does not emit light at the predetermined luminance.

When the direction of the lamination on the substrate is upward, the vertical organic light-emitting transistor is formed above the thin-film transistor as described above. In the layer formed on the upper side of the thin-film transistor, large irregularities and edges are formed due to the shape of the thin-film transistor. When irregularities are formed so as to straddle the layers, or an edge is formed so as to divide the layers, a leakage current path is formed, whereby a leakage current may be generated from the current supply line.

With the above configuration, it is possible to prevent the generation of the leakage current and the parasitic capacitance generated in the layer formed on the substrate side of the current supply line.

In addition, when the current supply line is formed by being laminated on the upper side of the thin-film transistor, the organic resin layer also has an effect of covering irregularities and edges formed by the thin-film transistor and leveling the surface. As a result, another layer including the wiring can be formed on the flattened surface as compared with the related art, so that variations in the quality of the wiring and the like are prevented, and the yield is improved.

Note that the organic resin layer is preferably formed of a material having a dielectric constant lower than that of the insulating film layer formed between the gate electrode and the source electrode of the vertical organic light-emitting transistor in order to further prevent the leakage current and the parasitic capacitance. The organic resin layer may not be configured to be in contact with the current supply line and the gate electrode of the vertical organic light-emitting transistor.

The organic resin layer in the present specification is formed as an insulating film so as to cover a part of the layer in order to reduce the leakage current and the parasitic capacitance and thus may be referred to as an "overcoat layer".

The display may include at least one auxiliary line that is wired in the second direction and connects at least two of the plurality of current supply lines.

Further, in the display, the auxiliary line may be formed in the same layer as the current supply line.

With the above configuration, the current supply lines are wired in a lattice shape, and hence the resistance value from the driver that supplies the current to the source electrode of each vertical organic light-emitting transistor is reduced. Even when wiring degradation or disconnection occurs in some current supply lines, the vertical organic light-emitting transistor connected to the current supply line, in which the failure has occurred, is supplied with a current from another current supply line via the auxiliary line.

Further, by forming the current supply line and the auxiliary line as the same layer, the current supply line and the auxiliary line are directly connected without passing through the contact hole. As a result, the resistance value from the driver to the source electrode of the vertical organic light-emitting transistor can be reduced.

In the display, a bank layer may be provided between the current supply line and the light-emitting layer.

With the above configuration, as in the case of the current supply line described above, there is no possibility that the light-emitting layer and the auxiliary line are energized, and the generation of unintended light emission and unintended current including a leakage current can be prevented. Hence, the leakage current generated from the auxiliary line is almost eliminated, and an influence on the amount of current flowing through the current supply line is also reduced. Therefore, the voltage fluctuation of the current supply line is further reduced.

In the display, the source electrode of the vertical organic light-emitting transistor may be formed across at least two or more of the vertical organic light-emitting transistors.

With the above configuration, not a current supply line wired with a predetermined width but the source electrode functions as a current supply line, and the current supplied from the driver to each vertical organic light-emitting transistor is supplied to each vertical organic light-emitting transistor such that the current is diffused. Therefore, the resistance value from the driver to the source electrode of each vertical organic light-emitting transistor is greatly reduced.

In addition, for example, in a region where many contact holes can be formed in the vicinity of the driver, a resistance value generated between the current supply line and the source electrode of each vertical organic light-emitting transistor can be minimized by the connection to the layer forming the source electrode of the vertical organic light-emitting transistor.

When the above configuration is adopted, from the viewpoint of reducing the resistance value from the driver to each vertical organic light-emitting transistor, the material constituting the source electrode is preferably formed of a material having a lower resistance than the material of the current supply line formed as the wiring, for example, a carbon nanotube.

Advantageous Effects of Invention

According to the present invention, a display using a vertical organic light-emitting transistor, in which voltage fluctuation of a current supply line is reduced, is achieved.

DESCRIPTION OF EMBODIMENTS

Figure 1:
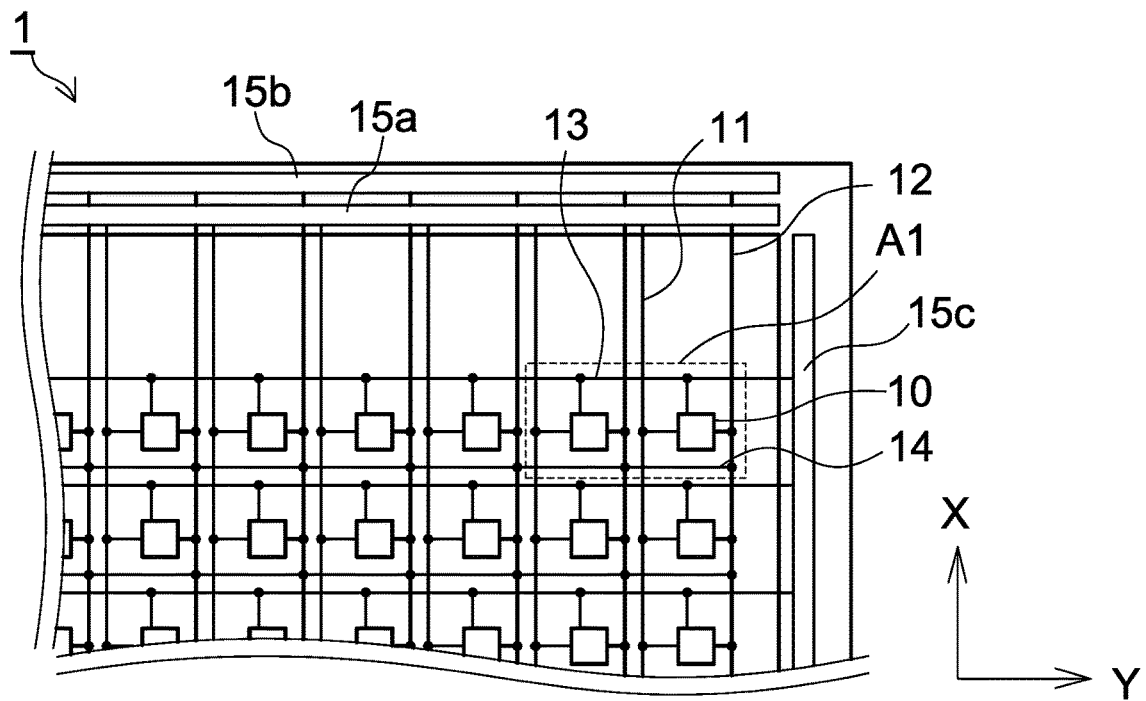
FIG. 1 is a schematic configuration diagram of a part of one embodiment of a display.

Hereinafter, a configuration of a display of the present invention will be described with reference to the drawings. Note that the following drawings are all schematically illustrated, and the dimensional ratio and the number in the drawings do not necessarily coincide with the actual dimensional ratio and number.

First Embodiment

FIG. 1 is a schematic configuration diagram of a part of one embodiment of a display 1. As illustrated in FIG. 1, the display 1 of the present embodiment includes a light-emitting unit 10 arranged in an array and each including a vertical organic light-emitting transistor 20 (FIG. 2) to be described later, a data line 11, a current supply line 12, a gate line 13, and an auxiliary line 14.

Further, the display 1 includes, in the outer edge portion, a source driver 15a that supplies a voltage corresponding to image data displayed on the gate electrode of the vertical organic light-emitting transistor 20 to the data line 11, a current supply unit 15b that supplies a current to the current supply line 12 and supplies a current to the source electrode of the vertical organic light-emitting transistor 20, and a gate driver 15c that outputs a control signal of a thin-film transistor 21 (FIG. 2) to the gate line 13.

Figure 2:
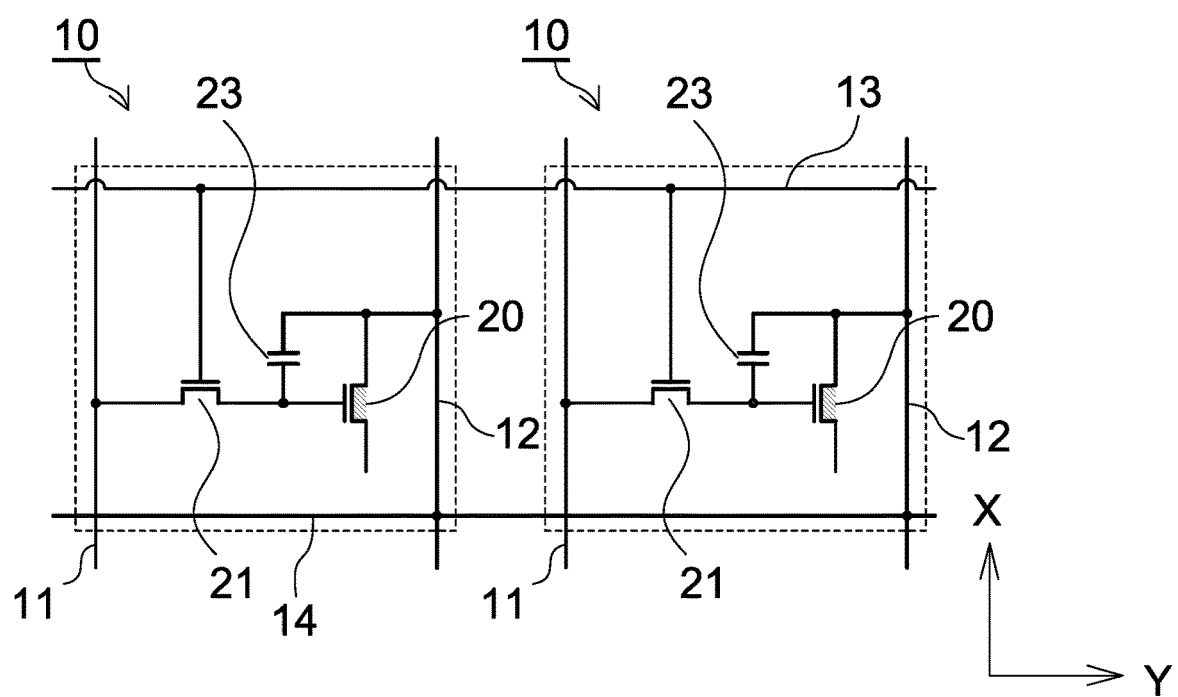
FIG. 2 is a circuit diagram of a light-emitting unit in a region A1 of the display of FIG. 1.

FIG. 2 is a detailed circuit diagram of the light-emitting unit 10 in the region A1 of the display 1 of FIG. 1. As illustrated in FIG. 2, the light-emitting unit 10 includes the vertical organic light-emitting transistor 20, the thin-film transistor 21 that controls the voltage supply to the gate electrode of the vertical organic light-emitting transistor 20, and a capacitor 23 formed between the source electrode and the gate electrode of the vertical organic light-emitting transistor 20. In the description of FIGS. 1 and 2, a direction in which the current supply line 12 is wired is referred to as an X direction (first direction), and a direction in which the auxiliary line 14 is wired is referred to as a Y direction (second direction).

The data line 11 is wiring that applies a voltage output from the source driver 15a to the gate electrode of the vertical organic light-emitting transistor 20 via the thin-film transistor 21 in order to adjust the light emission luminance of the vertical organic light-emitting transistor 20 in accordance with an image to be displayed. In the present embodiment, the data line 11 is formed in the X direction but may be formed in the Y direction.

The plurality of current supply lines 12 are wired in the X direction outside the formation region of the vertical organic light-emitting transistor 20 so as to be connected to the respective groups of the vertical organic light-emitting transistors 20 arranged in the X direction. Each current supply line 12 supplies a current output from the current supply unit 15b to the source electrode of each vertical organic light-emitting transistor included in the group of the vertical organic light-emitting transistors 20.

The gate line 13 is connected to the gate electrode of the thin-film transistor 21, transmits a control signal output from the gate driver 15c toward the gate electrode of the thin-film transistor 21, and switches on/off of the thin-film transistor 21 to control energization between the gate electrode of the vertical organic light-emitting transistor 20 and the data line 11. In the present embodiment, the gate line 13 is formed in the Y direction but may be formed in the X direction.

The auxiliary line 14 is wired in the Y direction between the light-emitting units arranged in the X direction and connects the plurality of current supply lines 12. Note that the auxiliary line 14 may not be formed between all the light-emitting units 10 arranged in the X direction. In the present embodiment, the current supply line 12 is formed in the X direction, and the auxiliary line 14 is formed in the Y direction. However, the current supply line 12 may be formed in the Y direction, and the auxiliary line 14 may be formed in the X direction.

The capacitor 23 is a voltage holding element disposed between the gate electrode and the source electrode of vertical organic light-emitting transistor 20 to maintain a displayed image for a predetermined time while thin-film transistor 21 is in an off-state.

Figure 3A:
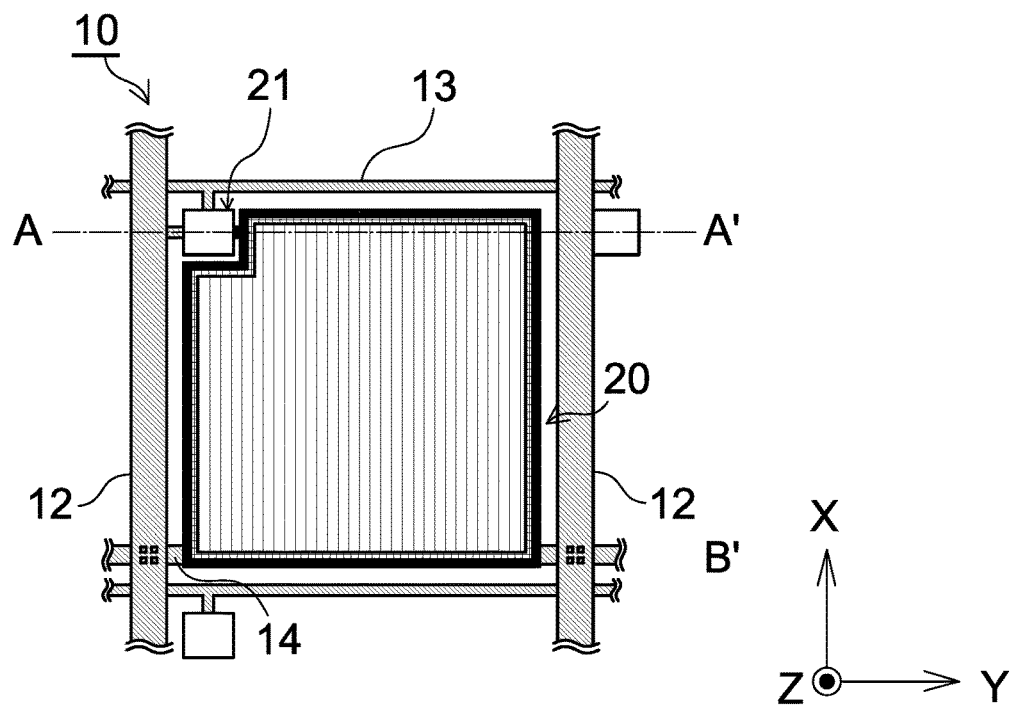
FIG. 3A is a top view of a schematic element configuration of the light-emitting unit and its periphery according to one embodiment.
Figure 3B:
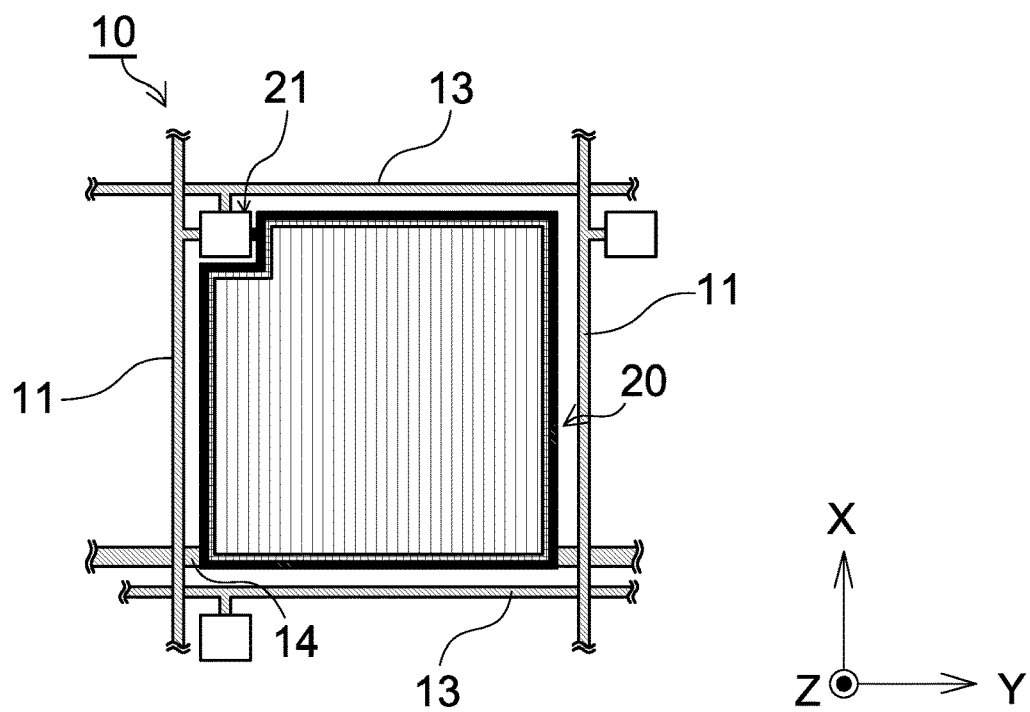
FIG. 3B is a view illustrating an off-state where a current supply line 12 has been removed from FIG. 3A.
Figure 4:
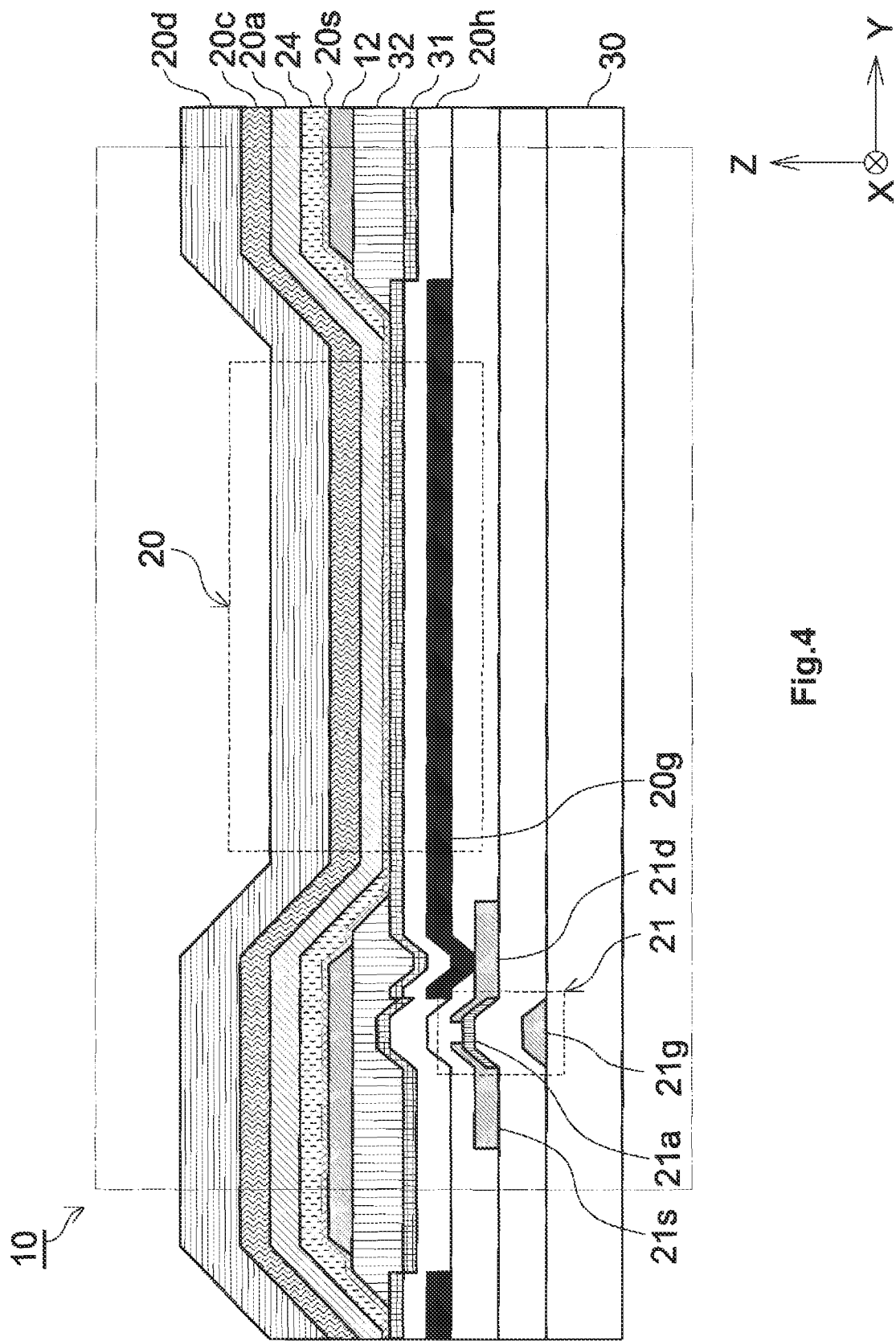
FIG. 4 is a cross-sectional view taken along line A-A' of FIG. 3A.

Next, the structure of each element formed on the substrate will be described. FIG. 3A is a top view of a schematic element configuration of the light-emitting unit 10 and its periphery according to one embodiment, and FIG. 3B is a view in a state where the current supply line 12 has been removed from FIG. 3A. FIG. 4 is a cross-sectional view taken along line A-A' of FIG. 3A. As illustrated in FIGS. 3B and 4, a set of the vertical organic light-emitting transistor 20 and the thin-film transistor 21 is formed in a region divided by the data line 11 and the gate line 13.

The vertical organic light-emitting transistor 20 illustrated in FIGS. 3A and 3B is illustrated by cutting out a part of a region that is also referred to as a formation region as described above. However, a drain electrode layer 20d, a light-emitting layer (organic semiconductor layer 20a, organic EL layer 20c), a source electrode layer 20s, and the like of the vertical organic light-emitting transistor 20 of the present embodiment are formed across the plurality of vertical organic light-emitting transistors 20 as illustrated in FIG. 4.

A substrate 30 is transparent to light and emits light emitted from the vertical organic light-emitting transistor 20 to the outside. Specific materials will be described later.

In the following description, a direction in which the data line 11 and the current supply line 12 are wired is referred to as an X direction (first direction), a direction in which the gate line 13 is wired is referred to as a Y direction (second direction), and a direction orthogonal thereto is referred to as a Z direction (third direction). At the time of expressing the direction, when the positive and negative directions are to be distinguished, the directions are described with positive and negative signs such as "+Z direction" and "−Z direction", and when the direction is to be expressed without distinguishing the positive and negative directions, the direction is simply described as "Z direction".

In the configuration of the vertical organic light-emitting transistor 20, the following layers are formed from the +Z side: the drain electrode layer 20d corresponding to the cathode electrode, the organic EL layer 20c and the organic semiconductor layer 20a forming the light-emitting layer, the source electrode layer 20s configured to apply a conductive material (carbon nanotubes in the present embodiment) containing carbon to the surface of a surface layer 31, and a gate electrode layer 20g on the −Z side via a gate insulating film layer 20h made of a dielectric.

In the vertical organic light-emitting transistor 20 having the above configuration, when a voltage is applied to the gate electrode layer 20g, a Schottky barrier between the organic semiconductor layer 20a and the source electrode layer 20s changes, and when the voltage exceeds a predetermined threshold value, a current flows from the source electrode layer 20s to the organic semiconductor layer 20a and the organic EL layer 20c to emit light.

A bank layer 24 is formed between the organic semiconductor layer 20a and the current supply line 12 in order to electrically insulate the organic semiconductor layer 20a and the current supply line 12. Although the X direction is not illustrated in FIG. 4, the source electrode layer 20s is applied to the XY plane on the +Z side of the current supply line 12 and is formed to be in direct contact with the current supply line 12. That is, the bank layer 24 is formed between the organic semiconductor layer 20a and the current supply line 12, and the organic semiconductor layer 20a and the current supply line 12 (source electrode layer 20s) are electrically insulated.

In the current supply line 12, an organic resin layer 32 for electrically insulating the substrate 30 side (−Z side) is formed. Here, in order to prevent the leakage current generated from the current supply line 12, the organic resin layer 32 in the present embodiment is made of a material having a dielectric constant lower than that of the material constituting the gate insulating film layer 20h but may be made of a material having a dielectric constant higher than that of the material constituting the gate insulating film layer 20h. A specific material constituting the organic resin layer 32 will be described later.

Furthermore, in order to prevent a leakage current generated between the source electrode layer 20s and the gate electrode layer 20g, the organic resin layer 32 in the present embodiment is more desirably formed between the source electrode layer 20s and the gate electrode layer 20g so as to overlap with the peripheral end of the gate electrode layer 20g.

In the display 1 of the present embodiment, the substrate 30 is made of a material having transparency to visible light, and the gate electrode layer 20g and the source electrode layer 20s are configured to have a gap through which visible light can pass, so that light emitted from the organic EL layer 20c is emitted to the outside through the substrate 30 to display an image.

In the thin-film transistor 21, a source electrode layer 21s and a drain electrode layer 21d are connected via an oxide semiconductor layer 21a, and a gate electrode layer 21g is formed below the oxide semiconductor layer 21a via an insulating film layer or a dielectric layer. When a voltage is applied to the gate electrode layer 21g, a channel is formed in the oxide semiconductor layer 21a, and the source electrode layer 21s and the drain electrode layer 21d are energized.

In the thin-film transistor 21, the source electrode layer 21s is connected to the data line 11, and the drain electrode layer 21d is connected to the gate electrode layer 20g of the vertical organic light-emitting transistor 20.

As illustrated in FIG. 3B, the vertical organic light-emitting transistor 20 is formed so as to fill almost the entire region divided by the data line 11 and the gate line 13 in order to increase luminance. The thin-film transistor 21 is formed as small as possible at the corner of the divided region so as to have a small influence on the light-emitting region of the vertical organic light-emitting transistor 20.

Although the capacitor 23 is not illustrated in FIGS. 3A to 4, as illustrated in FIG. 3A, the vertical organic light-emitting transistor 20 of the present embodiment is disposed such that the source electrode layer 20s and the gate electrode layer 20g face each other with the gate insulating film layer 20h interposed therebetween. As a result, the vertical organic light-emitting transistor 20 includes the capacitor 23 as a parasitic element, and the capacitor 23 can also perform a voltage maintaining function. In the capacitor 23 being the parasitic element as thus described, when the capacitance value is insufficient, another capacitor may be formed additionally.

Hereinafter, materials used for each layer will be exemplified and listed.

As the gate line 13 and the auxiliary line 14, it is possible to adopt aluminum (Al), titanium (Ti), molybdenum (Mo), tungsten (W), niobium (Nb), magnesium (Mg), silver (Ag), copper (Cu), an alloy of a combination thereof, and the like.

As the substrate 30, it is possible to adopt a glass material, a plastic material such as poly ethylene terephthalate (PET), poly ethylene naphthalate (PEN), or polyimide, or the like.

As the drain electrode layer 20d of the vertical organic light-emitting transistor 20, it is possible to adopt an alloy of a combination of monolayer or multilayer graphene, carbon nanotube, aluminum (Al), lithium fluoride (LiF), molybdenum oxide (MoxOy), indium tin oxide (ITO), zinc oxide (ZnO), magnesium (Mg), silver (Ag), gold (Au), and others, and the like.

As the gate electrode layer 20g of the vertical organic light-emitting transistor 20, it is possible to adopt: materials containing metal-doped oxides such as zinc oxide (ZnO), indium oxide ($In_2O_3$), tin dioxide ($SnO_2$), and cadmium oxide (CdO) doped with metals like aluminum (Al), tin (Sn), yttrium (Y), scandium (Sc), and gallium (Ga), an undoped transparent conductive oxide, and a combination thereof; aluminum (Al), gold (Au), silver (Ag), platinum (Pt), cadmium (Cd), nickel (Ni), tantalum (Ta), and a combination thereof; p or n-doped silicon (Si) and gallium arsenide (GaAs); and the like.

As the gate insulating film layer 20h between the surface layer 31 and the gate electrode layer 20g of the vertical organic light-emitting transistor 20, it is possible to adopt organic compounds such as silicon oxide (SiOx), aluminum oxide ($Al_2O_3$), silicon nitride ($Si_3N_4$), yttrium oxide ($Y_2O_3$), lead titanate (PbTiOx), aluminum titanate (AlTiOx), glass, a parylene polymer, polystyrene, polyimide, polyvinyl phenol, polymethyl methacrylate, and a fluoropolymer, and the like.

As the organic semiconductor layer 20a of the vertical organic light-emitting transistor 20, it is possible to adopt: linear condensed polycyclic aromatic compounds (or acene compounds) such as naphthalene, anthracene, rubrene, tetracene, pentacene, and hexacene, and derivatives thereof; pigments such as copper phthalocyanine (CuPc)-based compounds, azo compounds, perylene-based compounds, and derivatives thereof, for example; low molecular weight compounds such as hydrazone compounds, triphenylmethane-based compounds, diphenylmethane-based compounds, stilbene-based compounds, allylvinyl compounds, pyrazoline-based compounds, triphenylamine derivatives (TPD), allylamine compounds, low molecular weight amine derivatives (a-NPD), 2,2',7,7'-tetrakis(diphenylamino)-9,9'-spiro-bifluorene (spiro-TAD), N, N'-di(1-naphthyl)-N, N'-diphenyl-4,4'-dimonobiphenyl (spiro-NPB), 4,4', 4'-tris [N-3 methylphenyl-N-phenylamino] triphenylamine (mMT-DATA), 2,2', 7,7'-tetrakis(2,2-diphenylvinyl)-9,9-spirobifluorene (spiro-DPVBi), 4,4'-bis(2,2-diphenylvinyl) biphenyl (DPVBi), (8-quinolinolato) aluminum (Alq), tris(8-quinolinolato) aluminum (Alq3), tris(4-methyl-8 quinolinolato) aluminum (Almq3), and derivatives thereof, for example; polymer compounds such as polythiophenes, poly(p-phenylenevinylene) (PPV), biphenyl group-containing polymers, dialkoxy group-containing polymers, alkoxyphenyl PPV, phenyl PPV, phenyl/dialkoxy PPV copolymers, poly(2-methoxy-5-(2'-ethylhexyloxy)-1,4-phenylenevinylene) (MEH-PPV), poly(ethylenedioxythiophene) (PEDOT), poly(styrenesulfonic acid) (PSS), poly(aniline) (PAM), poly(N-vinylcarbazole), poly(vinylpyrene), poly(vinylanthracene), pyrene-formaldehyde resins, ethylcarbazole formaldehyde-halogenated resins, and modified products thereof, for example; n-Type transport organic small molecules, such as 5,5-diperfluorohexylcarbonyl-2,2:5,2:5,2-quaterthiophene (DFHCO-4T), DFH-4T, DFCO-4T, P (NDI2OD-T2), PDI8-CN2, PDIF-CN2, F16CuPc, and fullerenes, naphthalene, perylene, and oligothiophene derivatives, oligomers, polymers, aromatic compounds having a thiophene ring such as thieno [3,2-b] thiophene, dinaphthyl [2,3-b:2', 3'-f] thieno [3,2-b] thiophene (DNTT), and 2-decyl-7 phenyl [1] benzothieno [3,2-b] [1] benzothiophene (BTBT); and the like.

Here, as the vertical organic light-emitting transistor 20, it is possible to suitably use a hole injection layer, a hole transport layer, an organic EL layer, an electron transport layer, an electron injection layer, and the like, which are typically used for an OLED display, by appropriately selecting an organic semiconductor having an appropriate energy level. Then, the color of the light to be emitted to the outside is adjusted so as to emit light of colors such as red, green, and blue by selecting the material constituting the organic EL layer 20c described above. Furthermore, the vertical organic light-emitting transistor 20 may be configured to emit white light or may be configured to select and emit light of a desired color with a color filter by using the same vertical organic light-emitting transistor 20.

The surface layer 31 is a layer formed on the gate insulating film layer 20h for the purpose of fixing the source electrode layer 20s (in particular, the CNT layer). A material for forming the surface layer 31 can be formed by applying a composition containing a binder resin formed of a silane coupling material, an acrylic resin, and the like.

As the bank layer 24, it is possible to adopt inorganic insulating materials such as silicon oxide (SiO), silicon nitride ($Si_3N_4$), aluminum oxide ($Al_2O_3$), and aluminum nitride (AlN), an organic insulating material such as a polyimide resin, a siloxane resin, an acrylic resin, and a novolak resin, and the like.

As the organic resin layer 32, it is possible to adopt photosensitive materials having insulating properties such as an organic insulating material like a polyimide resin, a siloxane resin, an acrylic resin, and a novolak resin, and the like.

As the oxide semiconductor layer 21a included in the thin-film transistor 21, it is possible to adopt an In—Ga—Zn—O-based semiconductor, a Zn—O-based semiconductor (ZnO), an In—Zn—O-based semiconductor (IZO (registered trademark)), a Zn—Ti—O-based semiconductor (ZTO), a Cd—Ge—O-based semiconductor, a Cd—Pb—O-based semiconductor, CdO (cadmium oxide), an Mg—Zn—O-based semiconductor, an In—Sn—Zn-0-based semiconductor (e.g., $In_2O_3$—$SnO_2$—ZnO), an In—Ga—Sn—O-based semiconductor, and the like.

In the present embodiment, the thin-film transistor 21 is a thin-film transistor made of an oxide semiconductor but may be a thin-film transistor made of amorphous silicon. The thin-film transistor 21 may be either a p-type or an n-type. Furthermore, as a specific configuration, any configuration of a staggered type, an inverted staggered type, a coplanar type, an inverted coplanar type, and the like can be adopted.

As the vertical organic light-emitting transistor 20, the vertical organic light-emitting transistor 20 described in Patent Documents 1 and 2 can also be adopted, and furthermore, the configuration of Patent Document 3 can also be adopted.

Next, the manufacturing process of each layer will be briefly described. FIGS. 5A to 5I are schematic views of the periphery of one vertical organic light-emitting transistor 20 of the display 1 in the middle of the manufacturing process as viewed from the +Z side. Hereinafter, each step will be described with reference to the drawings.

A description will be given with reference to the drawings in which three vertical organic light-emitting transistors 20 arranged in the Y direction are formed such that the positional relationship with the adjacent vertical organic light-emitting transistors 20 and the structure between the vertical organic light-emitting transistors 20, that is, the structure outside the formation region, can be understood.

Note that the outside of the illustrated region may not be repeated in the same pattern. For example, as illustrated in FIG. 5D and the like, the thin-film transistor 21 is formed on the (+X, −Y) side but may be formed in an arbitrary pattern such as being formed on the (−X, +Y) side on the −X side with respect to the central portion in the X direction in the entire display 1.

Figure 5A:
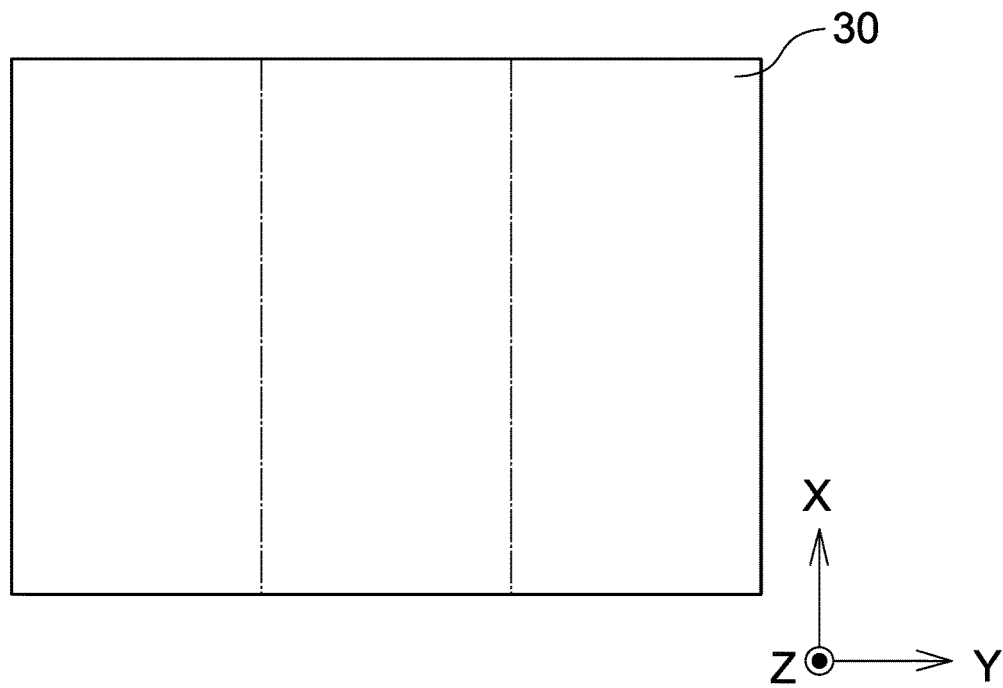
FIG. 5A is a schematic view of the periphery of one vertical organic light-emitting transistor of the display in the middle of a manufacturing process as viewed from a +Z side.

As illustrated in FIG. 5A, first, the substrate 30 is prepared (step S1).

Figure 5B:
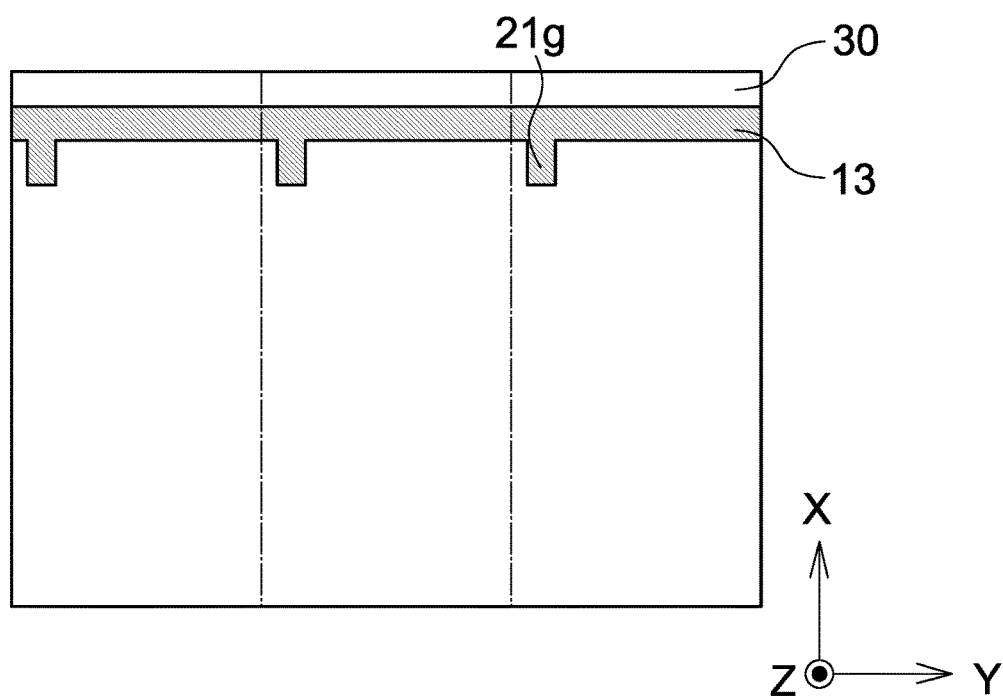
FIG. 5B is a schematic view of the periphery of one vertical organic light-emitting transistor of the display in the middle of the manufacturing process as viewed from the +Z side.

After step S1, as illustrated in FIG. 5B, the gate electrode layer 21g of the thin-film transistor 21 and the gate line 13 connected to the gate electrode layer 21g are formed on the substrate 30 (step S2).

Figure 5C:
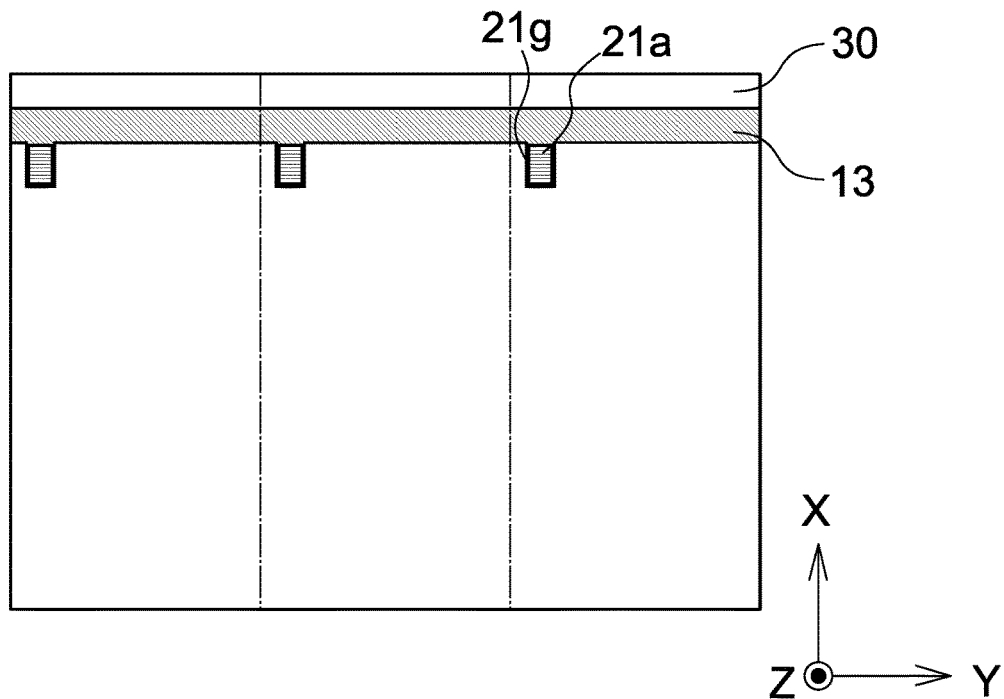
FIG. 5C is a schematic view of the periphery of one vertical organic light-emitting transistor of the display in the middle of the manufacturing process as viewed from the +Z side.
Figure 5D:
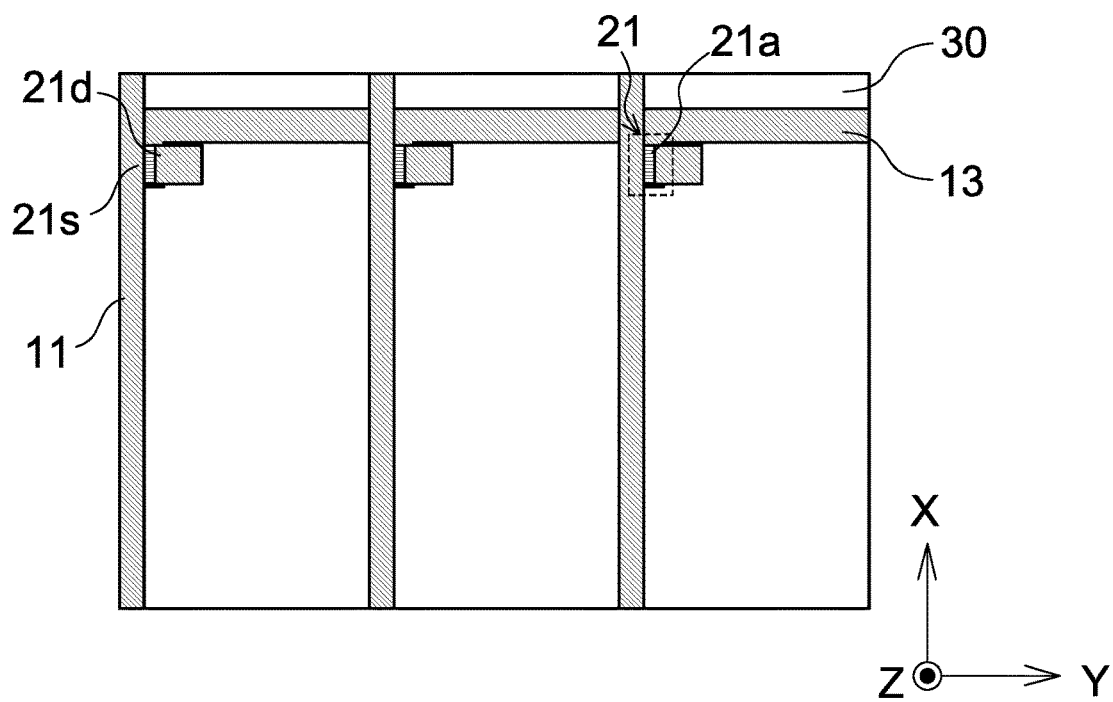
FIG. 5D is a schematic view of the periphery of one vertical organic light-emitting transistor of the display in the middle of the manufacturing process as viewed from the +Z side.

After step S2, an insulating film (not illustrated) is formed over the entire region, and as illustrated in FIG. 5C, the oxide semiconductor layer 21a is formed on the insulating film on the +Z side of the gate electrode layer 21g of the thin-film transistor 21 (step S3).

Here, being "formed over the entire region" means being formed over the entire image display region where the vertical organic light-emitting transistor 20 is formed, and does not mean being formed over the entire outer edge portion where the driver is disposed. This also applies to the following description.

After step S3, as illustrated in FIG. 5D, the drain electrode layer 21d and the data line 11 are formed on the oxide semiconductor layer 21a of the thin-film transistor 21 while separated from each other in the Y direction (step S4). The data line 11 constitutes the source electrode layer 21s of the thin-film transistor 21 in a portion overlapping with the oxide semiconductor layer 21a in the Z direction.

Figure 5E:
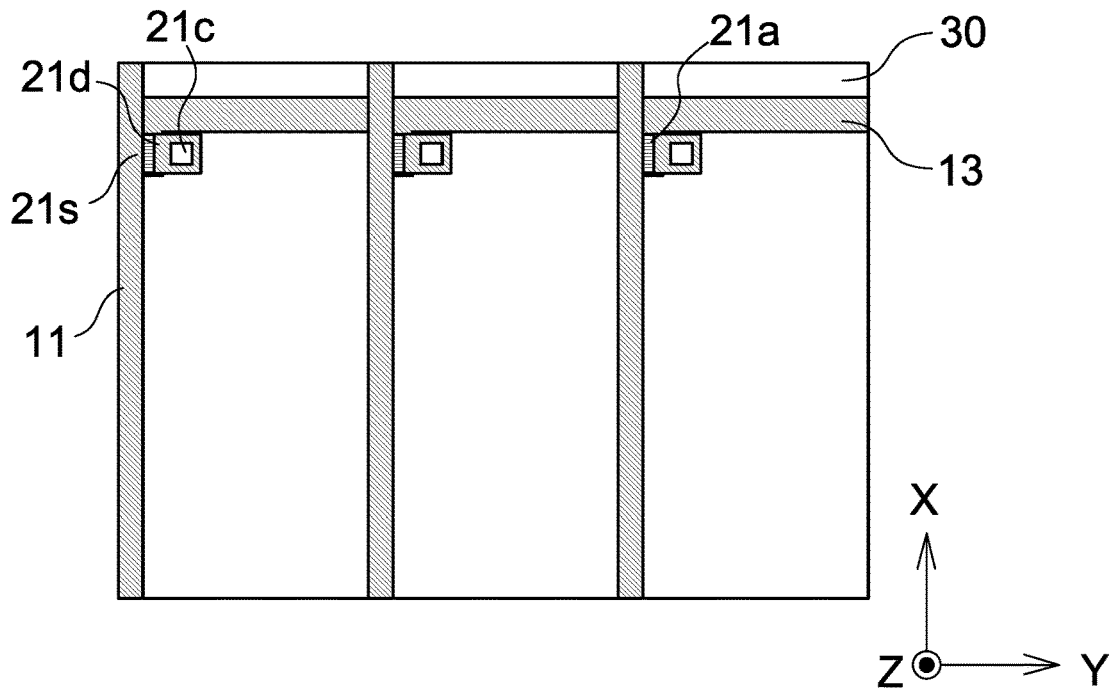
FIG. 5E is a schematic view of the periphery of one vertical organic light-emitting transistor of the display in the middle of the manufacturing process as viewed from the +Z side.

After step S4, a passivation film (not illustrated) is formed over the entire region, and then, as illustrated in FIG. 5E, a contact hole 21c is formed through which the drain electrode layer 21d of the thin-film transistor 21 communicates with the gate electrode layer 20g of the vertical organic light-emitting transistor 20 (step S5).

Figure 5F:
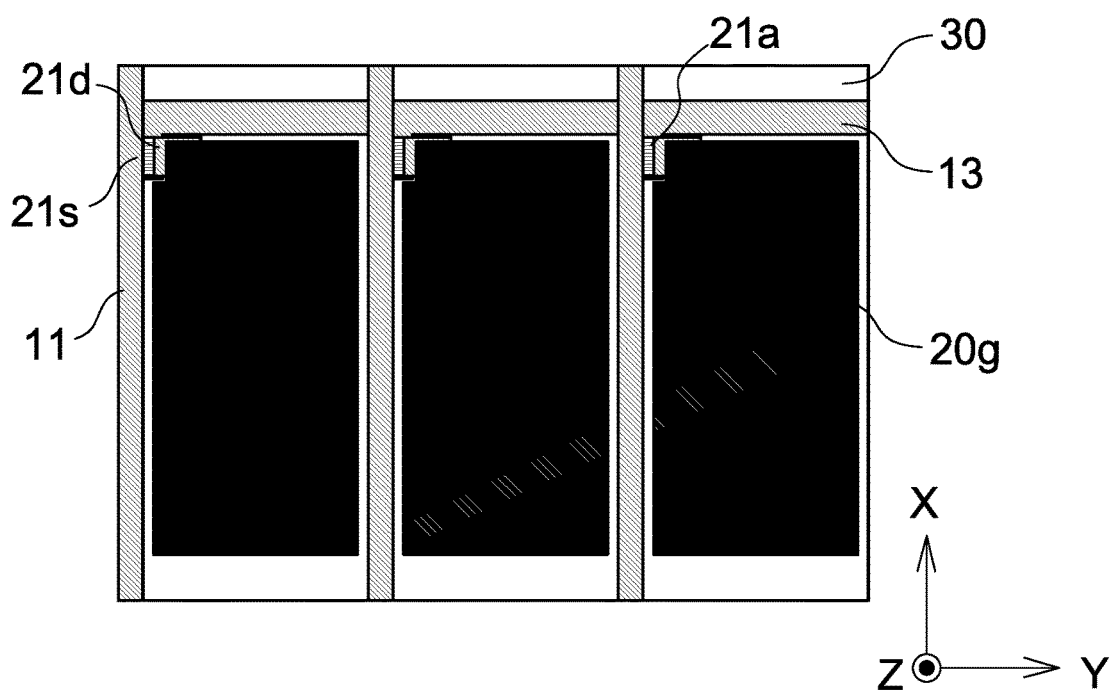
FIG. 5F is a schematic view of the periphery of one vertical organic light-emitting transistor of the display in the middle of the manufacturing process as viewed from the +Z side.

After step S5, as illustrated in FIG. 5F, the gate electrode layer 20g of the vertical organic light-emitting transistor 20 is formed (step S6).

After step S6, the gate insulating film layer 20h of the vertical organic light-emitting transistor 20 is formed over the entire region, and the surface layer 31 is formed on the gate insulating film layer 20h, and via holes are opened on appropriate regions outside of the pixel area for the interconnection and contact of various conductive layers (step S7). The gate insulating film layer 20h and the surface layer 31 are formed over the entire region in pixel area, and when the layers are illustrated, the entire configuration of the lower layer cannot be confirmed, and hence the layers are not illustrated in FIGS. 5G to 5I.

Figure 5G:
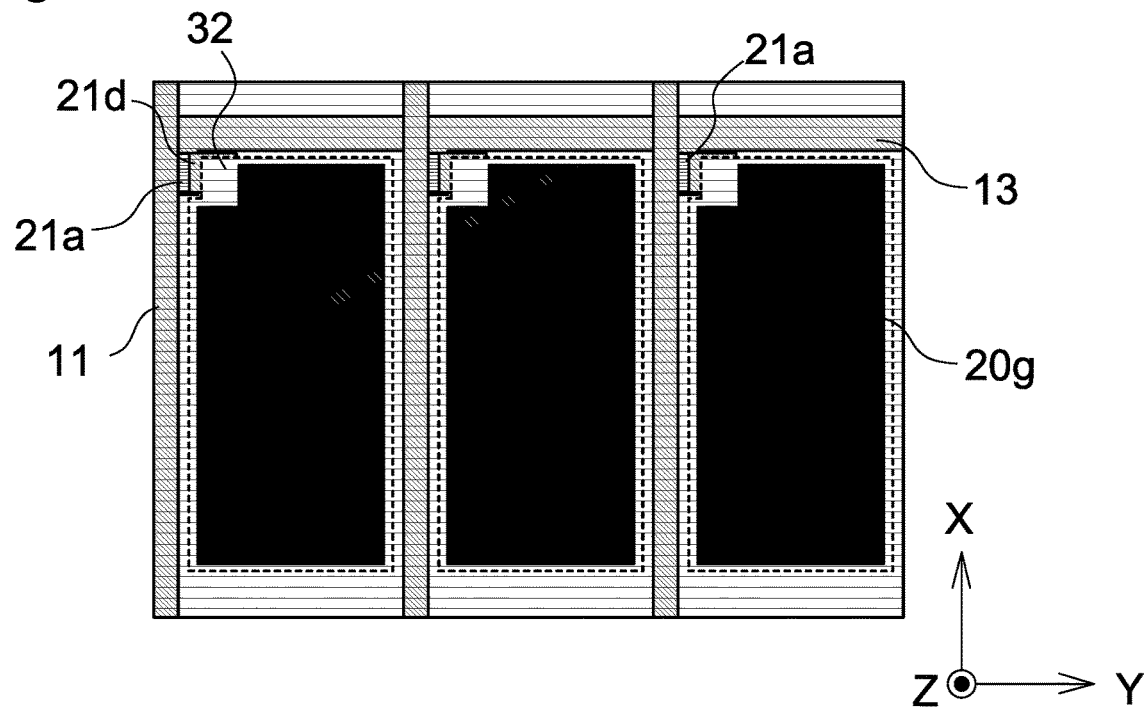
FIG. 5G is a schematic view of the periphery of one vertical organic light-emitting transistor of the display in the middle of the manufacturing process as viewed from the +Z side.

After step S7, as illustrated in FIG. 5G, the organic resin layer 32 is formed on the surface layer 31 outside the formation region of the vertical organic light-emitting transistor 20 (step S8). Note that a region indicated by a broken line in FIG. 5G indicates the entire gate electrode layer 20g of the vertical organic light-emitting transistor 20. That is, the organic resin layer 32 is formed so as to overlap with the peripheral end of the gate electrode layer 20g of the vertical organic light-emitting transistor 20 in the Z direction. In the present embodiment, the organic resin layer 32 is configured such that the width of the overlapping region is 2 μm from the outer edge of the gate electrode layer 20g except for a region where the thin-film transistor 21 is formed.

Figure 5H:
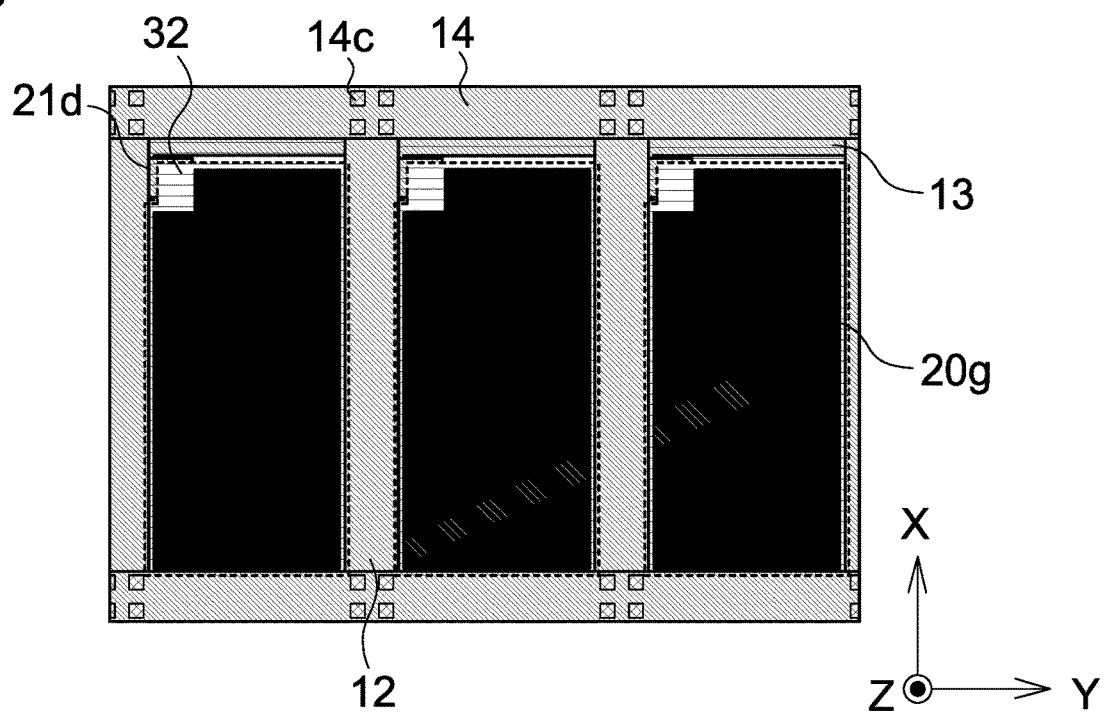
FIG. 5H is a schematic view of the periphery of one vertical organic light-emitting transistor of the display in the middle of the manufacturing process as viewed from the +Z side.

After step S8, as illustrated in FIG. 5H, the current supply line 12 is formed on the organic resin layer 32 in the X direction, and the auxiliary line 14 is formed so as to connect the current supply lines 12 in the Y direction (step S9). In the present embodiment, with the current supply line 12 and the auxiliary line 14 being formed in different layers, a contact hole 14c connecting the layers is also formed. As for the formation position and the configuration of the contact hole 14c, the contact hole 14c may be formed at any position in an appropriate shape or number.

After step S9, a contact hole for connecting the source electrode is opened at a predetermined position of the current supply line 12 by photolithography (step S10).

After step S10, the source electrode layer 20s of the vertical organic light-emitting transistor 20 made of carbon nanotubes is formed over the entire region (step S11). In the source electrode layer 20s, all the configurations of the lower layer cannot be confirmed, and therefore, the source electrode layer is not illustrated in FIG. 5I below.

Figure 5I:
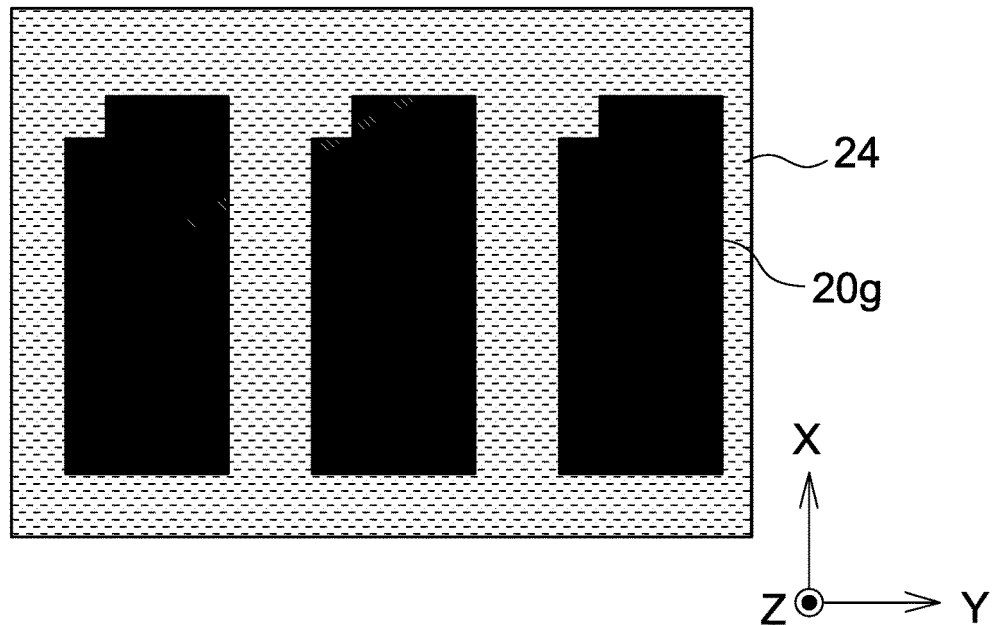
FIG. 5I is a schematic view of the periphery of one vertical organic light-emitting transistor of the display in the middle of the manufacturing process as viewed from the +Z side.

After step S11, the bank layer 24 is formed as illustrated in FIG. 5I (step S12).

After step S12, the organic semiconductor layer 20a, the organic EL layer 20c, and the drain electrode layer 20d to be the light-emitting layer are formed over the entire region, and the configuration illustrated in FIGS. 3A to 4 is formed.

By forming the display 1 having the above configuration by the manufacturing process as described above, the current supply line 12 is connected by the auxiliary line 14, and the voltage value of the connection portion of the other connected current supply line 12 is shared at the connection portion with the auxiliary line 14. That is, even when an extreme voltage drop occurs in a part due to the variation in the resistance value of the current supply line 12, the voltage is raised by the other current supply line 12 connected to the auxiliary line 14. As in the present embodiment, as the number of connection portions between the current supply line 12 and the auxiliary line 14 increases, the voltage of the current supply line 12 becomes uniform over the entire display 1.

In this way, the voltage of the current supply line 12 connected by the auxiliary line 14 is uniformized. Therefore, in each current supply line 12, it is possible to achieve the display 1 with improved display quality in which a local voltage drop is less likely to occur and a display defect is less likely to be visually recognized.

In the present embodiment, all of the drain electrode layer 20d, the organic semiconductor layer 20a, the organic EL layer 20c, and the source electrode layer 20s of the vertical organic light-emitting transistor 20 are formed across the plurality of vertical organic light-emitting transistors 20, but all of the layers may be formed for each vertical organic light-emitting transistor 20.

In addition, when each layer is formed for each vertical organic light-emitting transistor 20 and does not generate a leakage current from the current supply line 12, the bank layer 24 and the organic resin layer 32 may not be formed.

Second Embodiment

A configuration of a second embodiment of the display 1 of the present invention will be described focusing on portions different from the first embodiment.

Figure 6:
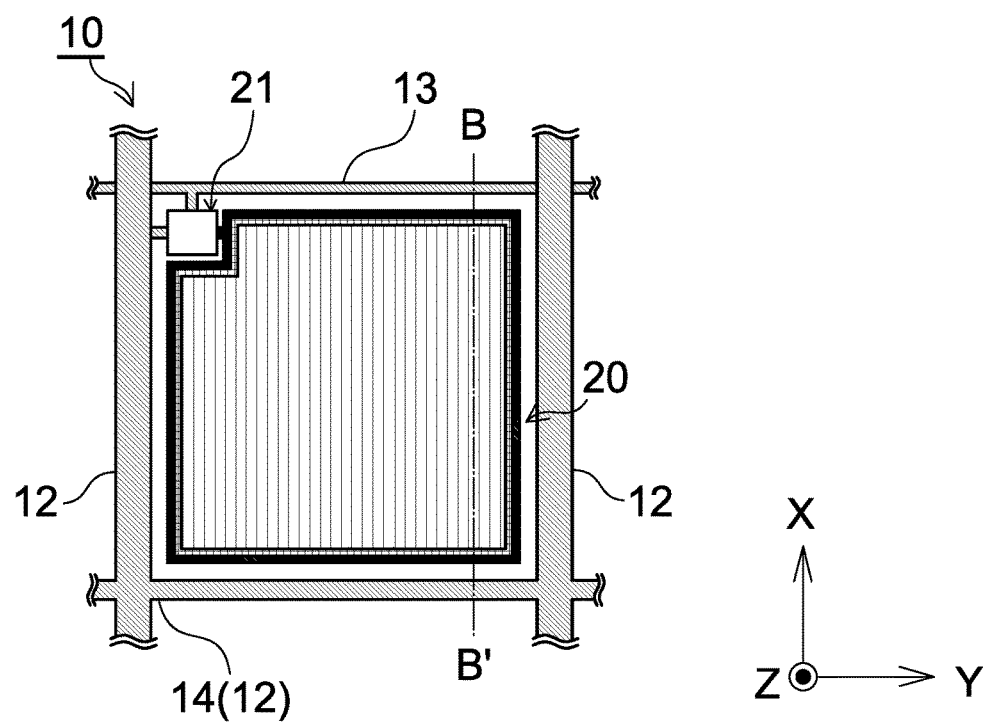
FIG. 6 is a top view of a schematic element configuration of a light-emitting unit and its periphery according to one embodiment.

FIG. 6 is a top view of a schematic element configuration of a light-emitting unit and its periphery according to one embodiment different from the first embodiment. As illustrated in FIG. 6, the current supply line 12 and the auxiliary line 14 may not be connected via the contact hole 14c but may be integrally formed of the same material in the same layer. In addition, the current supply line 12 and the auxiliary line 14 may be formed in the same layer and formed of different materials, or may be formed in different layers and formed of the same material.

Figure 7:
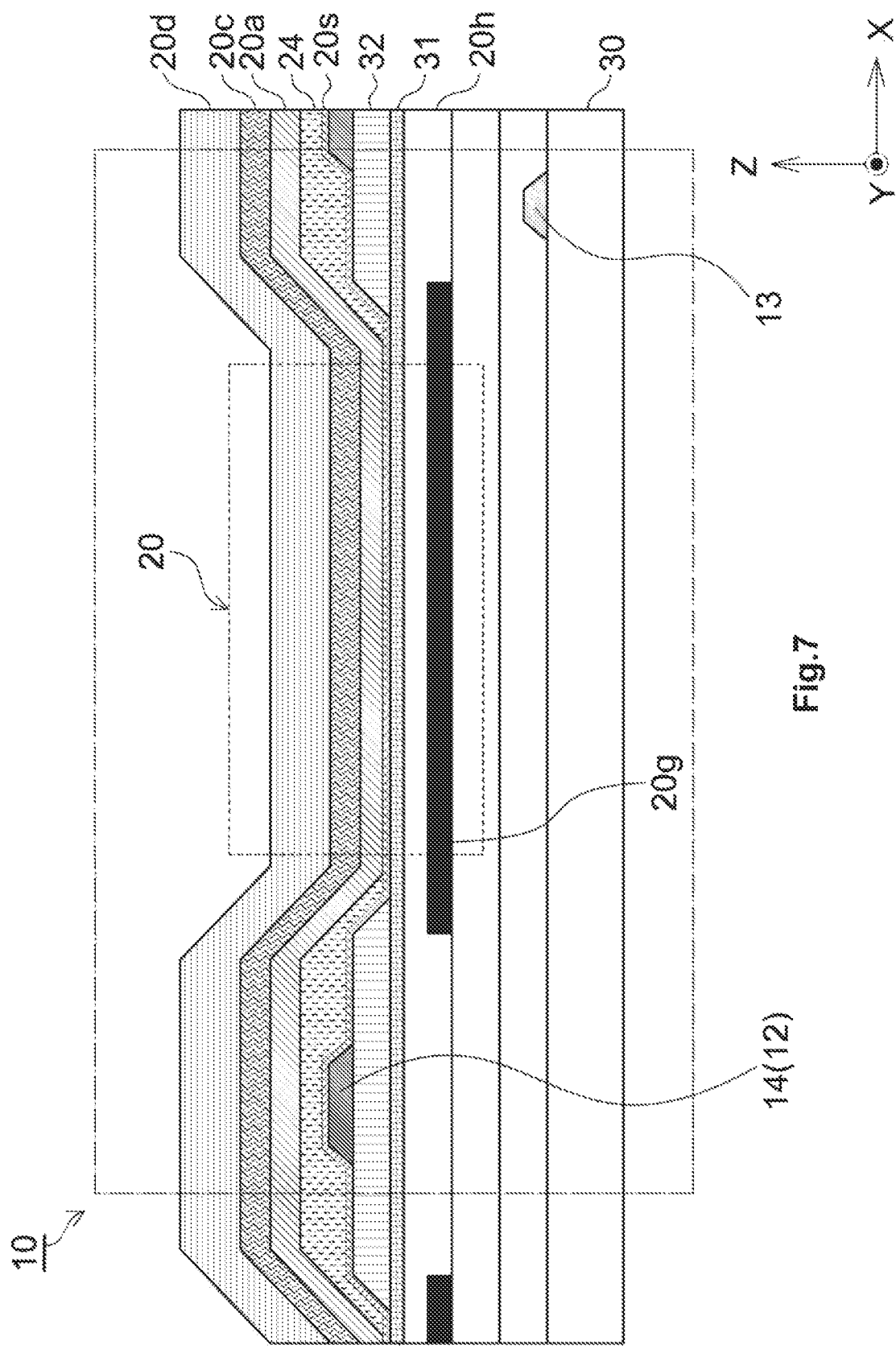
FIG. 7 is a cross-sectional view taken along line B-B' of FIG. 6.

FIG. 7 is a cross-sectional view taken along line B-B' of FIG. 6. As illustrated in FIG. 7, the auxiliary line 14 may be configured to be sandwiched between the bank layer 24 and the organic resin layer 32.

With the above configuration, even in the auxiliary line 14 integrally formed with the current supply line 12, the leakage current generated between the organic semiconductor layer 20a and the organic EL layer 20c can be prevented.

Note that the bank layer 24 may be formed between the source electrode layer 20s and the organic semiconductor layer 20a in a region different from the gate electrode layer 20g when viewed from the Z direction. Also, in the second embodiment, when each layer such as the drain electrode layer 20d is formed for each vertical organic light-emitting transistor 20, and a leakage current from the auxiliary line 14 hardly occurs, the bank layer 24 and the organic resin layer 32 may not be formed.

Figure 8:
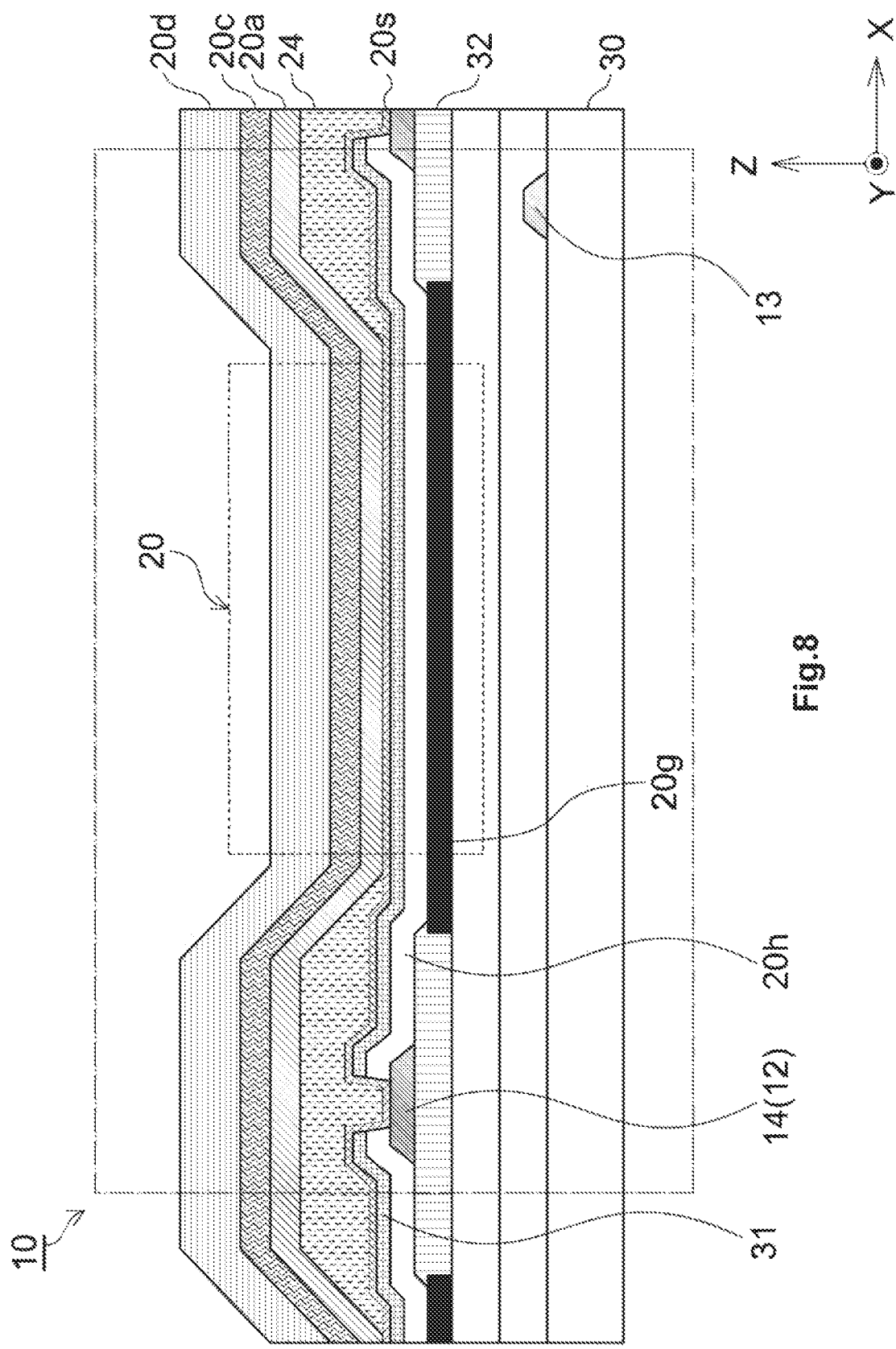
FIG. 8 is a cross-sectional view taken along line B-B' of FIG. 6.

FIG. 8 is a cross-sectional view taken along line B-B' of FIG. 6, which is different from FIG. 7. As illustrated in FIG. 8, the organic resin layer 32 may be formed on the same plane as the gate electrode layer 20g. In the case of this configuration, a contact hole that connects the source electrode layer 20s of the vertical organic light-emitting transistor 20 and the current supply line 12 is formed in the surface layer 31 and the gate insulating film layer 20h.

Furthermore, in the case of this configuration, so long as the distance between the gate electrode layer 20g of the vertical organic light-emitting transistor 20 and the current supply line 12 is sufficiently large on the XY plane, the organic resin layer 32 may not be formed, and the gate electrode layer 20g of the vertical organic light-emitting transistor 20 and the current supply line 12 may be formed on the same plane. The current supply line 12 may be a multi-layered structure comprising a transparent conductive layer that is formed at the same time with the gate electrode layer 20g, and a more conductive metal layer formed directly above or below abovementioned transparent conductive layer. This multi-layered structure will further reduce the resistance value of the current supply line 12.

In the second embodiment, even when viewed in the cross-section of the YZ plane as illustrated in FIG. 4, the arrangement relationship of the positions where the bank layer 24, the source electrode layer 20s, the current supply line 12, the organic resin layer 32, the surface layer 31, and the gate insulating film layer 20h are formed is the same in the Z direction. Note that the layers that are configured do not necessarily need to coincide with each other such that the organic resin layer 32 is formed on the −Z side of the auxiliary line 14 and that the organic resin layer 32 is not formed on the −Z side of the current supply line 12.

Another Embodiment

Hereinafter, another embodiment will be described.

Figure 9:
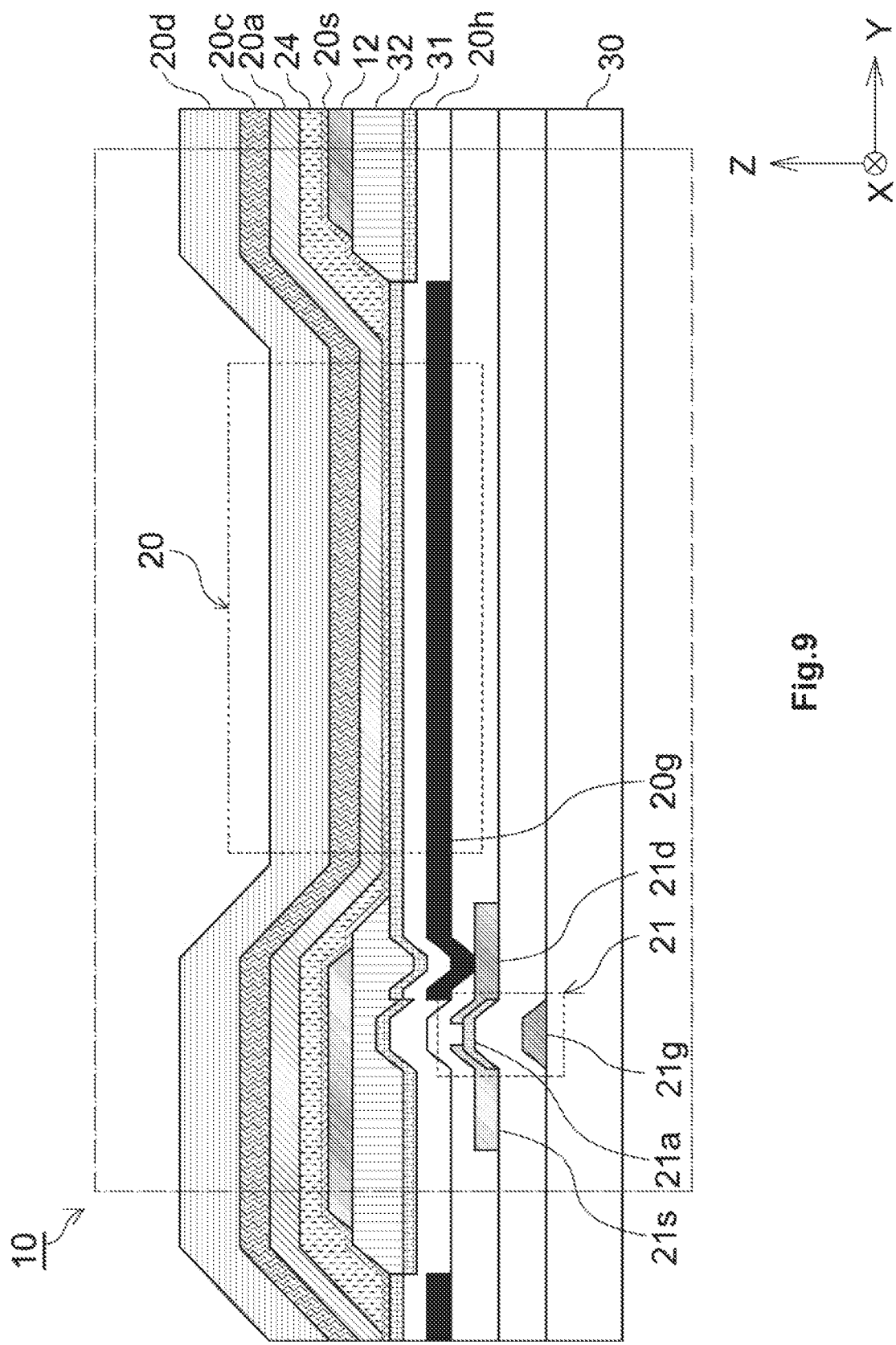
FIG. 9 is a cross-sectional view of a schematic element configuration of a light-emitting unit and its periphery according to another embodiment taken along a YZ plane.

<1> FIG. 9 is a cross-sectional view of a schematic element configuration of the light-emitting unit 10 and its periphery according to another embodiment taken along a YZ plane. As illustrated in FIG. 9, the organic resin layer 32 may not be formed in a part between the gate electrode layer 20g and the source electrode layer 20s, that is, may not overlap with the peripheral end of the gate electrode layer 20g. Further, the organic resin layer 32 may not be formed at all between the gate electrode layer 20g and the source electrode layer 20s.

<2> The configuration, the material, and the manufacturing process of the display 1 described above in each embodiment are merely examples, and the present invention is not limited to each configuration described above and each illustrated configuration.

DESCRIPTION OF REFERENCE SIGNS

1 Display
10 Light-emitting unit
11 Data line
12 Current supply line
13 Gate line
14 Auxiliary line
14c Contact hole
15a Source driver
15b Current supply unit
15c Gate driver
20 Vertical organic light-emitting transistor
20a Organic semiconductor layer
20c Organic EL layer
20d Drain electrode layer
20g Gate electrode layer
20h Gate insulating film layer
20s Source electrode layer
21 Thin-film transistor
21a Oxide semiconductor layer
21c Contact hole
21d Drain electrode layer
21g Gate electrode layer
21s Source electrode layer
23 Capacitor
24 Bank layer
30 Substrate 31 Surface layer
32 Organic resin layer

The invention claimed is:

1. A display comprising:
a substrate;
a plurality of vertical organic light-emitting transistors arranged in an array on the substrate in a first direction and a second direction orthogonal to the first direction, the vertical organic light-emitting transistors each being formed in order of a gate electrode, a source electrode, and a drain electrode from the substrate side in a third direction that is orthogonal to the first direction and the second direction and having a light-emitting layer between the source electrode and the drain electrode;
a data line that supplies a voltage to the gate electrode of the vertical organic light-emitting transistor;
a thin-film transistor that is connected between the gate electrode of each of the vertical organic light-emitting transistors and the data line and controls supply of a voltage to the gate electrode of the vertical organic light-emitting transistor;
a gate line that is connected to a gate electrode of the thin-film transistor and transmits a signal for switching between energization and interruption of the thin-film transistor; and
a plurality of current supply lines that are wired in the first direction outside a formation region of the vertical organic light-emitting transistor and in a region at the same distance from the substrate as the gate electrode of the vertical organic light-emitting transistor or a region more away from the substrate than the gate electrode with respect to the third direction, the current supply lines being in contact with the source electrode of the vertical organic light-emitting transistor to supply a current to the vertical organic light-emitting transistor,
wherein the source electrode of the vertical organic light-emitting transistor is formed across at least two or more of the vertical organic light-emitting transistors.

2. The display according to claim 1, wherein
the light-emitting layer of the vertical organic light-emitting transistor is formed across the plurality of vertical organic light-emitting transistors, and
a bank layer is provided between the current supply line and the light-emitting layer.

3. The display according to claim 2, wherein the bank layer is formed between the source electrode and the light-emitting layer and in a region different from the gate electrode when viewed from the third direction.

4. The display according to any one of claims 1 to 3, wherein an organic resin layer is provided between the current supply line and the gate electrode of the vertical organic light-emitting transistor.

5. The display according to claim 4, wherein the organic resin layer is formed between the gate electrode of the vertical organic light-emitting transistor and the source electrode of the vertical organic light-emitting transistor so as to overlap with a peripheral end of the gate electrode of the vertical organic light-emitting transistor when viewed from the third direction.

6. The display according to any one of claims 1 to 3, further comprising at least one auxiliary line that is wired in the second direction and connects at least two of the plurality of current supply lines.

7. The display according to claim 6, wherein the at least one auxiliary line is formed in the same layer as the current supply line.

8. The display according to claim 6, further comprising a bank layer between the at least one auxiliary line and the light-emitting layer.

9. The display according to any one of claims 1 to 3, wherein an organic resin layer is provided between the thin-film transistor and the gate electrode of the vertical organic light-emitting transistor outside of a light-emitting region and separate from the gate electrode of the vertical organic light-emitting transistor, a conductive line is formed on top of the organic resin layer along with a gate electrode layer during a same processing step, which become a part of the current supply line, which is a multilayered structure comprising more than one conductive layer, where the conductive layers in the multi-layered structure are separated by various insulating layers, and connected by via holes at certain places, or are in direct contact.

10. The display according to claim 6, wherein the at least one auxiliary line is a multi-layered structure, comprising conductive layers formed at a same time during a same processing step with a data line layer, a gate electrode layer of the vertical organic light-emitting transistor, and a current supply line layer, where the conductive layers in the multi-layered structure are separated by insulating layers, and connected by via holes at certain places, or are in direct contact.

* * * * *